US011316484B2

(12) United States Patent
Campbell (10) Patent No.: US 11,316,484 B2
(45) Date of Patent: Apr. 26, 2022

(54) OPTICALLY GATED TRANSISTOR SELECTOR FOR VARIABLE RESISTIVE MEMORY DEVICE

(71) Applicant: BOISE STATE UNIVERSITY, Boise, ID (US)

(72) Inventor: Kristy A. Campbell, Boise, ID (US)

(73) Assignee: Boise State University

( * ) Notice: Subject to any disclaimer, the term of this patent is extended or adjusted under 35 U.S.C. 154(b) by 415 days.

(21) Appl. No.: 16/513,024

(22) Filed: Jul. 16, 2019

(65) Prior Publication Data
US 2019/0363211 A1 Nov. 28, 2019

Related U.S. Application Data

(63) Continuation-in-part of application No. 15/990,067, filed on May 25, 2018, now Pat. No. 10,700,226.

(60) Provisional application No. 62/701,335, filed on Jul. 20, 2018, provisional application No. 62/511,119, filed on May 25, 2017.

(51) Int. Cl.
  *H01L 31/043* (2014.01)
  *H03F 3/08* (2006.01)
  (Continued)

(52) U.S. Cl.
  CPC ........... *H03F 3/08* (2013.01); *G11C 13/0069* (2013.01); *H01L 27/2409* (2013.01);
  (Continued)

(58) Field of Classification Search
  CPC ... H03F 3/08; G11C 13/0069; G11C 2213/72; G11C 2013/0088; G11C 2213/76;
  (Continued)

(56) References Cited

U.S. PATENT DOCUMENTS

| 6,867,996 B2 * | 3/2005 | Campbell | ........... H01L 45/1625 365/100 |
| 2001/0038367 A1 * | 11/2001 | Inukai | .................. G09G 3/2022 257/E27.111 |

(Continued)

OTHER PUBLICATIONS

Mircea Dragoman et al.; A SnS2-based photomemristor driven by sun; Journal of Applied Physics 123, 024506 Jan. 11, 2018.
(Continued)

*Primary Examiner* — Balram T Parbadia
(74) *Attorney, Agent, or Firm* — Parsons Behle & Latimer (57) ABSTRACT

An optically gated transistor (OGT) device that may be used as a selector device for one or more variable resistive memory devices. The OGT device isolates the one or more variable resistive memory devices when the OGT is not optically activated. The amount of current conducted by the OGT device is dependent on an intensity of light optically applied to the OGT device. The OGT device includes alternating layers of germanium selenide (GeSe) and GeSe plus an additional element deposited on a substrate. The OGT device includes only two electrodes connected to the alternating layers deposited on the substrate. The OGT device may generate an amplified electrical signal with respect to the magnitude of a received optical signal. The OGT device may be used to generate an optical signal having a different wavelength than the wavelength of a received optical signal.

28 Claims, 8 Drawing Sheets

(51) Int. Cl.
*H01L 31/103* (2006.01)
*H01L 31/032* (2006.01)
*H01L 31/0224* (2006.01)
*H01L 31/0216* (2014.01)
*H01L 27/24* (2006.01)
*H01L 31/147* (2006.01)
*G11C 13/00* (2006.01)

(52) U.S. Cl.
CPC ............... *H01L 31/02161* (2013.01); *H01L 31/022408* (2013.01); *H01L 31/0324* (2013.01); *H01L 31/1037* (2013.01); *H01L 31/147* (2013.01); *G11C 2213/72* (2013.01)

(58) Field of Classification Search
CPC . G11C 13/003; G11C 13/047; H01L 27/2409; H01L 31/02161; H01L 31/022408; H01L 31/0324; H01L 31/1037; H01L 31/147; H01L 27/2463; H01L 31/108; H01L 31/032; H01L 31/109; H01L 31/0224; H01L 45/085; H01L 45/143; H01L 45/1233; H01L 45/1266; H01L 45/1625; H01L 51/5016; H01L 45/144; H01L 51/006; H01L 51/0085; H01L 2224/48091; H01L 2251/5338; H01L 27/3244; H01L 45/1616; H01L 45/1675; H01L 51/0072; H01L 27/1461; H01L 27/14665; H01L 2924/00014; H01L 31/18; H01L 45/141; H01L 45/142; H01L 45/16; H01L 45/1641; H01L 51/0003; H01L 51/0047; H01L 51/0058; H01L 51/0059; H01L 51/0061; H01L 51/0073; H01L 51/0074; H01L 51/0077; H01L 51/42; H01L 51/422; H01L 51/4253; H01L 51/5012; H01L 51/5056; H01L 51/5064; H01L 51/5072; H01L 51/5237; H01L 51/56; H01L 2031/0344; H01L 21/02175; H01L 21/0228; H01L 2251/5353; H01L 2251/5361; H01L 2251/5384; H01L 2251/552; H01L 27/14607; H01L 27/14618; H01L 27/1463; H01L 27/14634; H01L 27/14643; H01L 27/14647; H01L 27/1467; H01L 27/286; H01L 27/307; H01L 27/3209; H01L 27/323; H01L 27/3262; H01L 27/3265; H01L 27/3281; H01L 31/022425; H01L 31/0296; H01L 31/0304; H01L 31/0336; H01L 31/035218; H01L 31/035227; H01L 31/053; H01L 31/072; H01L 45/06; H01L 45/1253; H01L 45/146; H01L 45/1608; H01L 45/165; H01L 45/1658; H01L 51/0004; H01L 51/0026; H01L 51/0039; H01L 51/0052; H01L 51/0054; H01L 51/0065; H01L 51/0068; H01L 51/0071; H01L 51/008; H01L 51/0097; H01L 51/4206; H01L 51/4226; H01L 51/4246; H01L 51/4266; H01L 51/442; H01L 51/448; H01L 51/502; H01L 51/504; H01L 51/508; H01L 51/5088; H01L 51/5092; H01L 51/5096; H01L 51/5203; H01L 51/5206; H01L 51/5221; H01L 51/5265; H01L 51/5278; C23C 14/0623; C23C 14/0629; C23C 14/14; C23C 14/34; C23C 14/3464; C23C 14/06; Y02E 10/549; Y02E 10/542; Y02E 10/50; G09G 2300/0842; G09G 3/3233; G09G 3/3258; G09G 2300/0426; G09G 2300/0465; G09G 2300/0861; G09G 2300/0866; G09G 2320/0233; G09G 2320/029; G09G 2320/043; G09G 3/2018; G09G 3/2022; G09G 3/30; G09G 3/3266; G09G 3/3291; H01G 9/2045; H01G 9/2009; H01G 9/2027; H01G 9/2031; H01G 9/2059; G01J 5/28
See application file for complete search history.

(56) References Cited

U.S. PATENT DOCUMENTS

| | | | | |
|---|---|---|---|---|
| 2002/0021266 | A1* | 2/2002 | Koyama | H01L 27/3244 345/76 |
| 2002/0039044 | A1* | 4/2002 | Kwak | G05F 3/262 327/540 |
| 2003/0173558 | A1* | 9/2003 | Campbell | H01L 45/142 257/E45.002 |
| 2003/0197563 | A1* | 10/2003 | Nishizono | H03G 3/3084 330/308 |
| 2003/0228717 | A1* | 12/2003 | Li | H01L 45/085 438/95 |
| 2004/0043585 | A1* | 3/2004 | Moore | H01L 45/085 438/510 |
| 2004/0175859 | A1* | 9/2004 | Campbell | G11C 13/0011 438/102 |
| 2004/0238809 | A1* | 12/2004 | Adamec | H01J 1/3044 438/20 |
| 2006/0046444 | A1* | 3/2006 | Campbell | H01L 45/1641 438/510 |
| 2006/0186394 | A1* | 8/2006 | Campbell | H01L 45/143 257/3 |
| 2007/0104493 | A1* | 5/2007 | Kimura | H03F 1/3205 398/202 |
| 2009/0090905 | A1* | 4/2009 | Tokita | H01L 51/42 257/40 |
| 2012/0098029 | A1* | 4/2012 | Mazumder | H01L 31/1113 257/E27.011 |
| 2013/0306927 | A1* | 11/2013 | Marsh | H01L 21/0228 423/276 |
| 2013/0327377 | A1* | 12/2013 | Ting | B82Y 10/00 257/E51.015 |
| 2014/0268465 | A1* | 9/2014 | Veliadis | H02H 1/0023 361/101 |
| 2015/0144195 | A1* | 5/2015 | Irwin | H01L 51/4253 136/265 |
| 2015/0357357 | A1* | 12/2015 | Sargent | H04N 5/33 257/448 |
| 2016/0035496 | A1* | 2/2016 | Irwin | H01L 51/0003 136/265 |
| 2017/0104545 | A1* | 4/2017 | Shiraishi | H03F 3/45089 |
| 2017/0117859 | A1* | 4/2017 | Aina | H03F 3/211 |
| 2017/0141330 | A1* | 5/2017 | Tsunoi | C07F 15/0033 |
| 2017/0179409 | A1* | 6/2017 | Yamaguchi | H01L 51/0085 |
| 2017/0288155 | A1* | 10/2017 | Kurihara | C09K 11/06 |
| 2017/0373263 | A1* | 12/2017 | Stubbs | H01L 51/5092 |
| 2018/0076394 | A1* | 3/2018 | Kawakami | C07D 307/77 |
| 2018/0151630 | A1* | 5/2018 | Yamaoka | H01L 51/5056 |
| 2018/0182961 | A1* | 6/2018 | Kawakami | H01L 51/006 |
| 2018/0182976 | A1* | 6/2018 | Kurihara | C07D 495/04 |
| 2018/0233540 | A1* | 8/2018 | Saito | H01L 51/008 |
| 2018/0308998 | A1* | 10/2018 | Swelm | H01L 31/022425 |

OTHER PUBLICATIONS

Tengfei Pei et al; Few-layer SnSe2 transistors with high on/off ratios; Applied Physics Letters 108, 053506 (2016) Feb. 5, 2016.
H. S. Song et al; High-performance top-gated monolayer SnS2 field-effect transistors and their integrated logic circuits; Nanoscale RSCPublishing 2013.
Hua Xu; High Responsivity and Gate Tunable Graphene-MoS 2 Hybrid Phototransistor; ResearchGate Jun. 2014.

(56) References Cited

OTHER PUBLICATIONS

A. Abderrahmane et al; High photosensitivity few-layered MoSe2 back-gated field-effect phototransistors; IOPScience; iopscience.iop.org Aug. 20, 2014.

Yuan Huang; Hybrid quantum dot-tin disulfide field-effect transistors with improved photocurrent and spectral responsivity; Applied Physics Letters 108, 123502 (2016) Mar. 24, 2016.

Bablu Mukherjee; NIR Schottky Photodetectors Based on Individual Single-Crystalline GeSe Nanosheet; ACS Applied Materials & Interfaces; www.acsami.org Sep. 12, 2013.

Lin Tao et al; N-Channel and P-channel few-layer InSe photoelectric devices; RSC Advances RSC Adv., 2017, 7, 49694 Oct. 25, 2017.

* cited by examiner

OPTICALLY GATED TRANSISTOR SELECTOR FOR VARIABLE RESISTIVE MEMORY DEVICE

RELATED APPLICATIONS

This application claims priority to and the benefit of U.S. Provisional Patent Application Ser. No. 62/701,335 filed on Jul. 20, 2018, and entitled "Application of optically-gated transistor as a memristor selector switch," the contents of which are hereby incorporated by reference herein in its entirety. The application is a continuation-in-part patent application of U.S. patent application Ser. No. 15/990,067 filed on May 25, 2018, and entitled "Optically Activated Transistor, Switch, and Photodiode," the contents of which are hereby incorporated by reference herein in its entirety.

GOVERNMENT LICENSE RIGHTS

The invention disclosed herein was funded in-part or in-whole by the U.S. Air Force Research Laboratory under Contract No. FA8750-16-C-0183. The government has certain rights in the invention disclosed herein.

FIELD OF THE DISCLOSURE

The embodiments described herein relate programming memory devices with apparatuses that conduct current bi-directionally in the presence of light, and methods of programming memory devices using electrical current conducted bi-directionally in the presence of light.

DESCRIPTION OF THE RELATED ART

The use of variable resistive memory devices has been difficult due the variable resistive nature of the memory devices. One type of variable resistive memory device is a restive random-access memory, referred to as restive RAM, ReRAM, or RRAM. Restive RAM is random-access (RAM) memory that works by changing the resistance across a solid-state material.

Memristors are bipolar devices having a positive potential in order to program, i.e. write to, the device at a lower resistance, and a negative potential to revise the state of the memristor device back to a higher resistance. When a plurality of memristors are incorporated into a circuit each memristor device may behave like it is a part of a resistive network. Sneak path currents within an array of memristor devices, or the like, provide an additional path or paths for current providing a false resistance reading of the memristor devices. It would be beneficial to use a selector device that may be used to isolate the variable resistive memory devices from a circuit.

One potential selector device for programming a memristor is a diode. However, a diode does not operate bidirectionally. Thus, a diode selector device would not properly function as a selector device for an array of bipolar memristors. Potentially, two opposite facing diodes in parallel could provide bidirectional functionally but may be undesirable due to added real estate on a chip as well as other fabrication complexities. Another potential selector device is a transistor. A field-effect transistor (FET) uses an electric field to control the electrical behavior of the transistor. One example of a FET is a metal-oxide-semiconductor field-effect transistor (MOSFET). A MOSFET includes a source terminal, a drain terminal, and a gate terminal and includes a drain-source on resistance, or total resistance, between the drain terminal and the gate terminal. The drain-source on resistance may be problematic in using a MOSFET as a selector device for various resistance memory devices.

The resistive nature of the memristors may create multiple paths of current flow, referred to as sneak path currents, in an array even when only a single element is being addressed. These sneak path currents may cause a false reading of the state of the addressed memristor. Typically, a MOSFET transistor may be used in an array where the voltages applied to the bit and word lines are at fixed values and the memory element receives a non-variable voltage. However, when the MOFSET transistor is used to gate a resistance variable or memristor element, and the bit and word line voltages are fixed, then the gated on resistance of the MOSFET source to drain channel is in series with the resistance memory element, creating a voltage divider between the two resistances. Since the resistance variable memory element may have different resistances the voltage drop across the resistance may vary, thus changing the programming conditions to unknown conditions and limiting or preventing control of the programmed resistance state. For example, a typical programming voltage may not be high enough to raise the resistance of the memristor to a desired state. Other disadvantages may exist.

SUMMARY

The present disclosure is directed to methods, apparatus, and systems that address at least some of the problems and disadvantages discussed above. It would be beneficial to provide an optically gate transistor (OGT) device to be used as a selector device for one or more variable resistive memory device types or devices.

One embodiment is an optically activated device. The optically activated device comprises a substrate, a first layer comprising germanium selenide (GeSe), and a second layer comprising GeSe and another element. The optically activated device comprises a third layer comprising GeSe, wherein the second layer is positioned between the first layer and the third layer, wherein the first layer, second layer, and the third layer comprises an active material. The active material conducts current bidirectionally in a presence of light, and wherein the active material does not conduct appreciable current in the absence of light.

The optically activated device may include at least one electrode connected to the third layer. The optically activated device may include a fourth layer comprising GeSe and the element, wherein the third layer is positioned between the second layer and the fourth layer. The optically activated device may include a fifth layer comprising GeSe, wherein the fourth layer is positioned between the third layer and the fifth layer. The optically activated device may include a silicon dioxide layer positioned between the first layer and the substrate. The optically activated device may include a first electrode electrically connected to the fifth layer and a second electrode electrically connected to the fifth layer. The first layer, second layer, third layer, fourth layer, and fifth layer of the optically activated device may comprise the active material. The active material conducts current in a presence of light and does not conduct appreciable current in the absence of light.

The active material of the optically activated device may conduct current bidirectionally depending on a voltage applied to the active material. For example, a negative current is conducted for a negative voltage and a positive current is conducted for a positive voltage. An amount of current conducted by the active material may be dependent on an intensity of light applied to the active material. The optically activated device may include no more than two electrodes in contact with the active material. The optically active device may exhibit a current-voltage curve with operating regions that include at least a linear region and a saturation region.

The first layer of the optically activated device may have a thickness of approximately 100 angstroms, the second layer of the optically activated device may have a thickness of approximately 10 angstroms to 30 angstroms, the third layer of the optically activated device may have a thickness of approximately 100 angstroms, the fourth layer of the optically activated device may have a thickness of approximately 10 angstroms to 30 angstroms, and the fifth layer of the optically activated device may have a thickness of approximately 100 angstroms. The GeSe may comprise $Ge_2Se_3$. The element may comprise tin (Sn), aluminum (Al), carbon (C), Chromium (Cr), Tungsten (W), Titanium (Ti), or copper (Cu). The substrate may be a p-type silicon substrate.

One embodiment of the present disclosure is a system comprising a memory device and an optically gated transistor (OGT) device. The OGT device is capable of bidirectional operation. The OGT device connects the memory device to an electronic circuit when the OGT device is optically activated, and the OGT device isolates the memory device from the electronic circuit when the OGT device is not optically activated.

The OGT device may exhibit a current-voltage curve with operating regions that include at least a linear region and a saturation region. The memory device may comprise a memristor. The memory device may comprise a memristor array. The memory device may comprise an array of resistive random-access memory devices. The array of resistive random-access memory devices may be programmed simultaneously via optical imprinting based on a light intensity of an input signal across multiple memory elements. For example, the input signal may be an image. The OGT device may further comprise active material that comprises alternating layers of germanium selenide and layers of germanium selenide with an added element. The element may be copper or tin.

One embodiment of the present disclosure is an optical signal amplifier system. The optical signal amplifier system may comprise a light source and a first sub circuit configured to drive the light source to emit light having a magnitude greater than the incident light. The optical signal amplifier system includes an optically gated transistor (OGT) device. The optical signal amplifier system includes a second sub circuit connected to the OGT device, wherein the OGT device receives light emitted from the light source and provides an electrical signal based on the intensity of the received light. The second sub circuit may be configured to amplify the electrical signal with respect to the magnitude of emitted light. The first sub circuit and the second sub circuit may be incorporated into a single circuit.

One embodiment of the present disclosure is a system that comprises a first light source connected to a first circuit configured to drive the first light source to emit light having a first wavelength. The system comprises an optically gated transistor (OGT) device configured to receive the light emitted from the first light source. The system comprises a second light source connected to the OGT device, wherein receipt of light from the first light source by the OGT device causes the second light source to emit light having a second wavelength. The system may act as a light intensity amplifier. The second wavelength may differ from the first wavelength. The light emitted from the first light source may have a first intensity and the light emitted from the second light source may have a second intensity, wherein the second intensity is greater than the first intensity and wherein the second wavelength may be equal to the first wavelength. The system may act as a repeater to emit light having the same wavelength and intensity origination at a first light source even if the received light has diminished over distance. The light received by the OGT device from the first light source may have a first intensity and the light emitted from the second light source may have a second intensity, wherein the second intensity is greater than the first intensity and wherein the second wavelength may be equal to the first wavelength. The system could also be configured to reduce the intensity of light as would be recognized by one of ordinary skill in the art having the benefit of this disclosure

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

A selector device suitable for use with an array comprised of variable resistive memory devices, such as memristors, may be an OGT device as disclosed in U.S. Provisional Patent Application No. 62/511,119 entitled Optically Activated Transistor, Switch, and Photodiode filed on May 25, 2017 and U.S. patent application Ser. No. 15/990,067 entitled Optically Activated Transistor, Switch, and Photodiode filed on May 25, 2018, both which are herein incorporated by reference. An OGT device may control memristor element, or the like, programming through a combination of voltage and current, where the current is proportional to the intensity and wavelength of light applied to the gate. Operation of the OGT device is in an "enhancement" mode, whereby drain to source current may increase as a function of light intensity. To program the memristor, the OGT device may be operated in saturation, rather than between the active and cutoff modes typically used for a MOSFET transistor switch. The operation of the OGT device in saturation provides fixed valves for the voltages applied to the bit and word lines of a memristor array. To program the memristor, the OGT device could also be in the active mode, if desired. However, for multistate operation and programming, programming in the active mode may not be suitable.

The operation of the memristors with the OGT device may allow multi-state programming by light intensity control of the saturation current. The saturation current may apply an intrinsic current compliance to the memristor, thus fixing the memristor state. Thus, the intensity of light applied to the OGT device controls the programmed state of the memristor. Light is used to gate the OGT device on. Thus, the lack of light applied to the OGT device isolates the memristor, or memristor array, from the circuit.

Figure 1:
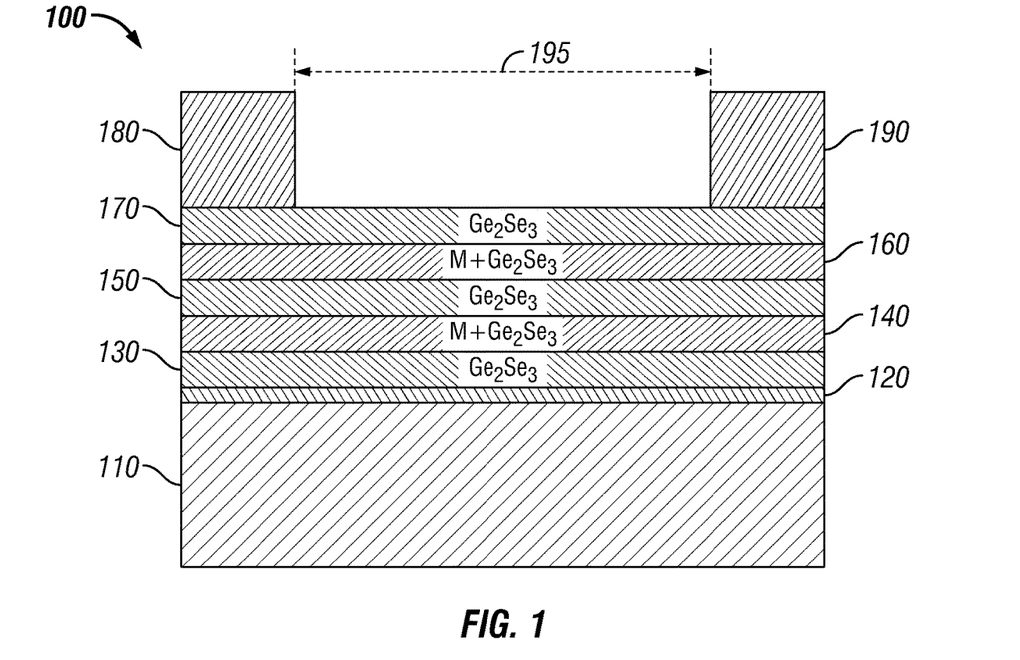
FIG. 1 is a schematic of an embodiment of an OGT device.

FIG. 1 shows a schematic of an embodiment of an OGT device 100. The OGT device 100 includes active material, which is comprised of a plurality of layers 130, 140, 150, 160, 170 deposited, onto a substrate 110. The substrate 110 may include doped silicon. In particular, the substrate 110 may be p-type silicon substrate. Other substrates, such as an n-type substrate, may also be contemplated. The substrate 110 includes an oxide layer 120, also referred to as an insulation layer, on the substrate 110. The oxide layer 120 may be, but is not limited to, a silicon dioxide ($SiO_2$) layer.

The active material is comprised of a plurality of layers 130, 140, 150, 160, 170 deposited onto the oxide layer 120 on the substrate 110. A first layer 130 is deposited onto the oxide layer 120. The first layer 130 may be germanium selenide (GeSe) without the addition of other elements. The first layer 130 may be formed by sputtering GeSe. Specifically, the first layer 130 may be $Ge_2Se_3$. A second layer 140 is deposited onto the first layer 130. The second layer 140 may include GeSe and an element. Specifically, the second layer 140 may be $Ge_2Se_3$ plus a metal. Examples of metals that may be used include tin (Sn) and copper (Cu). However, the element may be, but is not limited to, other materials such as aluminum (Al), tungsten (W), titanium (Ti), and carbon (C). Other elements may be used as would be appreciated by one of ordinary skill in the art having the benefit of this disclosure. The second layer 140 may be formed by co-sputtering the element with GeSe onto the first layer 130.

A third layer 150 is deposited onto the second layer 140. The third layer 150 is GeSe without any additional elements. Specifically, the third layer 150 may be $Ge_2Se_3$. The third layer 150 may be formed by sputtering GeSe onto the second layer 140. A fourth layer 160 is deposited onto the third layer 150. The fourth layer 160 may be GeSe and an element. Specifically, the fourth layer 160 may be $Ge_2Se_3$ plus a metal. Examples of metals that may be used include Sn and copper Cu. The fourth layer 160 may be formed by co-sputtering GeSe and the element onto the third layer 150. A fifth layer 170 is deposited onto the fourth layer 160. The fifth layer 170 may be germanium selenide (GeSe) without the addition of other elements. The fifth layer 170 may be formed by sputtering GeSe. Specifically, the fifth layer 170 may be $Ge_2Se_3$.

The first layer 130, second layer 140, third layer 150, fourth layer 160, and fifth layer 170 may have a combined thickness of approximately 360 angstroms The first layer 130, third layer 150, and fifth layer 170 may each have a thickness of approximately 100 angstroms. The second layer 140 and fourth layer 160 may each have a thickness of approximately 30 angstroms. The thicknesses of the substrate 110 and layers 120, 130, 140, 150, 160, and 170 are shown in FIG. 1 for illustrative purposes and may be varied depending on the application as would be appreciated by one of ordinary skill having the benefit of this disclosure.

The OGT device 100 includes two electrodes, or terminals, 180 and 190 connected to the fifth layer 170. The electrodes 180, 190 may be, but are not limited to, tungsten. The terminals 180, 190 may be comprised of other materials as would be appreciated by one of ordinary skill in the art having the benefit of this disclosure. The electrodes 180, 190 may be deposited onto the fifth layer 170 using a shadow mask. The electrodes may have a thickness of approximately 350 angstroms. Advantageously, the OGT device 100 only requires two electrodes, or terminals, 180, 190 to function as a transistor as opposed to the three terminals required of traditional FET devices. The OGT device 100 may function as an optically activated selector device as detailed herein. The electrodes 180, 190 may be separated by a distance 195. A larger distance 195 may produce a greater response, in terms of electrical conductivity, when in the presence of light. The distance 195 may range from 1 micrometer to 10 millimeters. This spacing is not to be considered as limiting. In one embodiment, the distance 195 may be approximately five (5) millimeters. The size, configuration, and location of the electrodes 180, 190 is shown in FIG. 1 for illustrative purposes and may be varied depending on application. For example, the electrodes 180, 190 may be configured to be in contact with the bottom layer (e.g., the first layer 130) and top layer (e.g., the fifth layer 170) as shown in regard to the OGT device 100J of FIG. 16. As discussed herein, the insulation layer 120 is optional and may be included in all configurations.

During operation, the OGT device 100 may be activated by the application of light 101 (best shown in FIGS. 2-5). The optical activation of the OGT device 100 permits the OGT device 100 to be used to electrically isolate a portion, or portions, of a circuit coupled to the electrodes 180, 190. The application of light switches on, or activates, the OGT device 100 to electrically connect an isolated portion of the circuit to the rest of the circuit as would be appreciated by one of ordinary skill in the art having the benefit of this disclosure. The OGT device 100 may be used to be an optically activated selector device used to program variable resistive memory devices as described herein.

Figure 2:
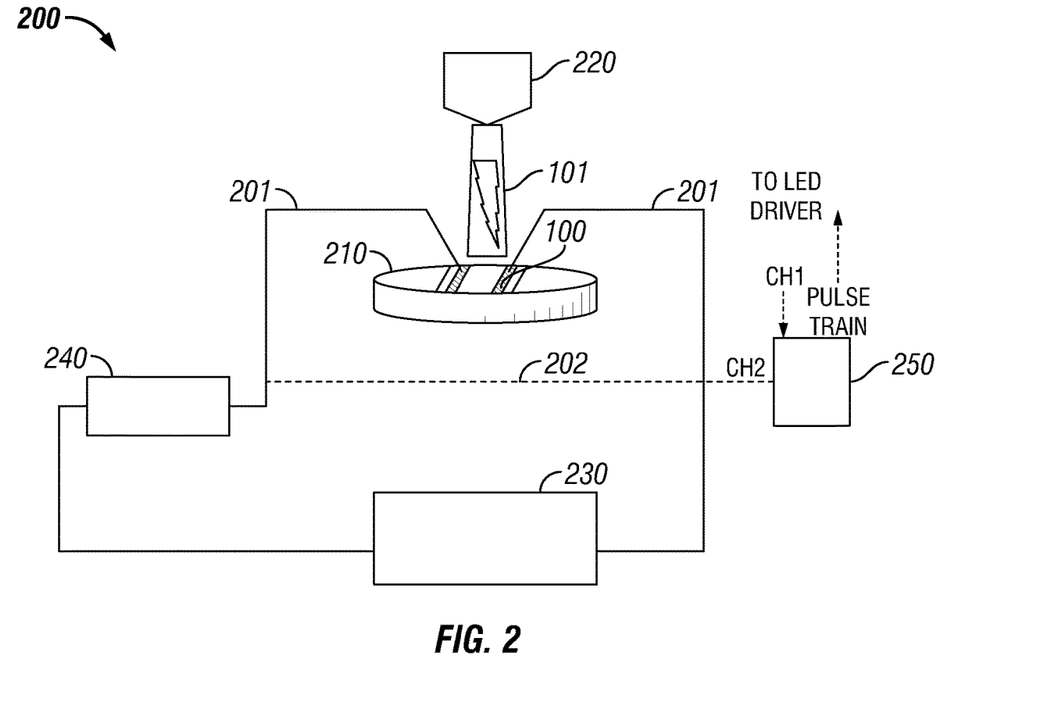
FIG. 2 is a schematic of an embodiment of a system used to electrically test an OGT device.

FIG. 2 is a schematic of a system 200 to electrically test an OGT device 100. The OGT device 100 may be placed on a microprobe station 210. For example, the OGT device 100 may be electrically tested on a microprobe station equipped with Cascade Microtech micromanipulators and size 7B W probe tips. The system 200 includes a device 230 that is used for current-voltage (I-V) measurements. For example, a HP4156A Semiconductor Parameter Analyzer may be used for I-V measurements.

The system 200 includes a light source 220 to provide light 101 on the OGT device 100 to activate, or in other words, gate ON the OGT device 100. For example, the light source 220 may be a 470 nm light emitting diode ("LED") (C503B-BAN-CY0C0461, Cree, Inc.). Other light sources may be used as would be appreciated by one of ordinary skill in the art having the benefit of this disclosure. For example, the light source 220 could be, but is not limited to, a broadband microscope light source (from the microprobe station) or LEDs with wavelengths of 385, 525, 590, 616, 770, 850, 1060, and 1200 nm. The light source 220 may be connected to a microscope objective of the microprobe station 210, so that the light source 220 is positioned directly above the OGT device 100 and roughly centered between the electrodes 180, 190 of the OGT device 100.

The system 200 includes a device 250 to drive the light source 220 as shown by arrows PULSE TRAIN and CH1. For example, the system 200 may include a driver circuit consisting of a series resistor and a variable DC voltage, supplied from a Digilent Analog Discovery 2. The device 250 may supply pulses for switching response tests as shown via path 202 on CH2. A two-channel oscilloscope on the device 250 may be used to collect the switching speed data from the OGT device 100. The system 200 may include a device (not shown) to measure the intensity of light 101 from the light source 220. For example, the intensity of the light 101 may be measured using a Thor Labs PM16-121 standard photodiode sensor with a detector area of 9.7 mm×9.7 mm.

The system 200 includes a variable resistive memory device 240, which may be a memristor. The system 200 includes electrical paths 201 electrically connecting the elements of the system 200. The memristor 240 is connected to the electrodes 180, 190 of the OGT device 100. The system 200 enable I-V sweep measurements with device 230 connected to one electrode 190 of the OGT device 100 and to a bottom electrode of the memristor 240. The I-V sweep measurements may be 'double sweep' measurements, meaning that the voltage was incremented forward to the end voltage, and then reversed back to the starting voltage. The voltage sweep measurements, in both the positive and negative voltage directions, may start and end at 0 V. To characterize the OGT device 100 alone, the voltage sweep may be ranged from 0 V to +/−10 V. The memristor 240 may be measured from 0 to +/−1 V using a 100 μA compliance current. The circuit of the system 200 may be measured using a voltage sweep of 0 V to +/−2 V. Pulse testing may be performed with device 250 by applying a square pulse train with a 50% duty cycle at a frequency of 100 Hz to drive the light source 220 in place of a DC supply. The device 250 may include a two-channel oscilloscope, which may be used to measure the switching time. To measure the switching time, the two-channel oscilloscope of device 250 may be connected to the pulse train input on the light source 220 drive circuit and to the top electrode of the memristor 240. The system 200 may be used to determine the I-V curves of the OGT device 100 as discussed herein.

Figure 3:
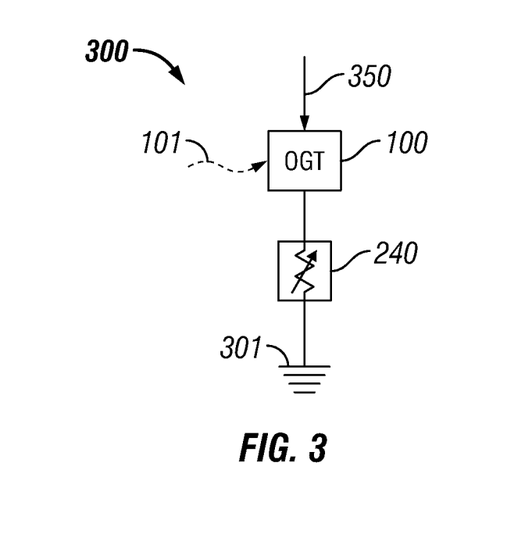
FIG. 3 is a schematic of an embodiment of an OGT device as a selector device for a variable resistive memory device.

FIG. 3 is a schematic of system 300 that uses an embodiment of an OGT device 100 as a selector for a variable resistive memory device 240, also referred to herein as memristor 240. The OGT device 100 is connected to memristor 240, which is connected to ground 301. The OGT device 100 is gated OFF in the absence of light 101, isolating the memristor 240 from the $V_{DD}$ 350 applied to the OGT device 100. When light 101 is applied to the OGT device 100, the OGT device 100 is gated ON permitting access to the memristor 240. As discussed herein, the memristor 240 can be programmed to a continuous range of non-volatile memory states using the saturation current of the OGT device 100 as a programming compliance current.

Figure 4:
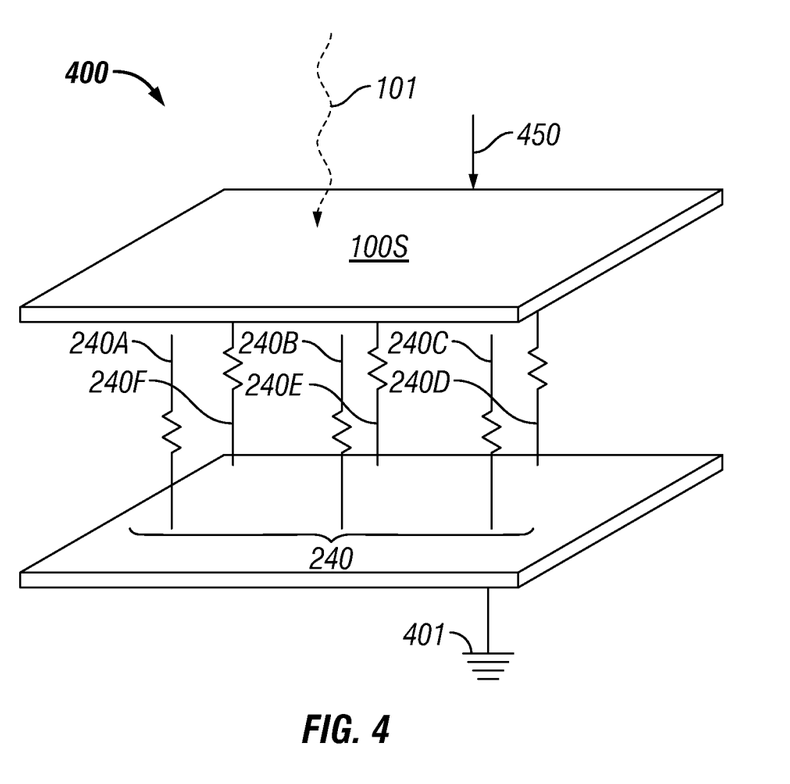
FIG. 4 is a schematic of an embodiment of an OGT device as a selector device for an array of variable resistive memory devices.

FIG. 4 is a schematic of system 400 that uses an embodiment of an OGT device 100S as a selector for a plurality, or array, of variable resistive memory devices 240A, 240B, 240C, 240D, 240E, 240F, which also may be referred to herein as memristors 240A-240F. The OGT device 100S is a blanket or sheet of OGT film used to be a selector device for one or more variable memory devices 240A-240F. The OGT device 100S is connected to the memristors 240A-240F, which are connected to ground 401. The OGT device 100S is gated OFF in the absence of light 101, isolating the memristors 240A-240F from the $V_{DD}$ 450 applied to the OGT device 100S. When light 101 is applied to the OGT device 100S, the OGT device 100S is gated ON permitting access to the memristors 240A-240F. As discussed herein, the memristors 240A-240F can be programmed to a continuous range of non-volatile memory states using the saturation current of the OGT device 100S as a programming compliance current. The number, size, and/or configuration of the array of variable resistive memory devices 240A-240F and the OGT device 100S are shown in FIG. 4 for illustrative purposes and may be varied depending on application as would be appreciated by one of ordinary skill in the art having the benefit of this disclosure.

Figure 5:
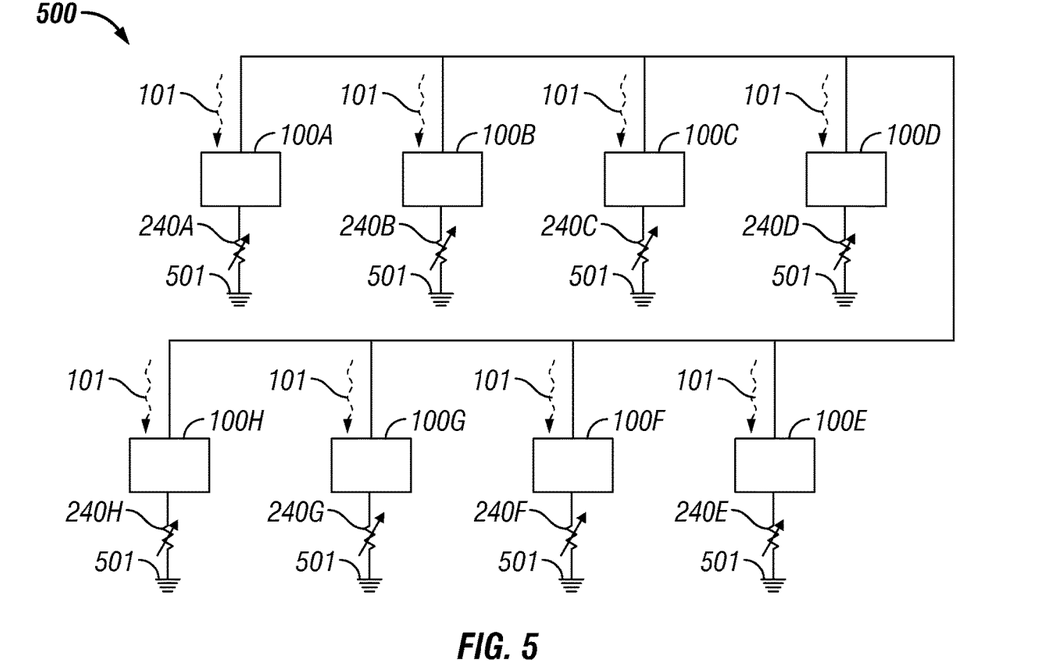
FIG. 5 is a schematic of an embodiment of an array of OGT device as selector devices for an array of variable resistive memory devices.

FIG. 5 is a schematic of system 500 that uses a plurality OGT devices 100A, 100B, 100C, 100D, 100E, 100F, 100G, 100H as selectors for a plurality of variable resistive memory devices 240A, 240B, 240C, 240D, 240E, 240F, 240G, 240H which also may be referred to herein as memristors 240A-240H. Each of the OGT devices 100A-100H is connected to one of the memristors 240A-240F, which are each also connected to ground 501. A $V_{DD}$ (not shown) is associated with each of the OGT device 100A-100H as would be appreciated by one of ordinary skill in the art having the benefit of this disclosure. The OGT devices 100A-100H are each gated OFF in the absence of light 101, isolating the memristors 240A-240H from the $V_{DD}$ applied to each of the OGT devices 100A-100H. When light 101 is applied to each of the OGT devices 100A-100H, the OGT devices 100A-100H are each gated ON permitting access to the memristors 240A-240H. As discussed herein, the memristors 240A-240F can be programmed to a continuous range of non-volatile memory states using the saturation currents of the OGT devices 100A-100H as a programming compliance current. An image may be used to apply light to the OGT devices 100A-100H. The system 500 of FIG. 5 may be used to simultaneously program a plurality of pixels onto a plurality of variable resistive memory devices 240A-240H. The system of 500 may eliminate the requirement of accessing a plurality of selector devices in corresponding sequence to store an image within an array of memory devices as would be appreciated by one of ordinary skill in the art having the benefit of this disclosure. The number, size, and/or configure of the variable resistive memory devices 240A-240H and OGT devices 100A-200H are shown in FIG. 5 for illustrative purposes and may be varied depending on the application as would be appreciated by one of ordinary skill in the art having the benefit of this disclosure.

Figure 6:
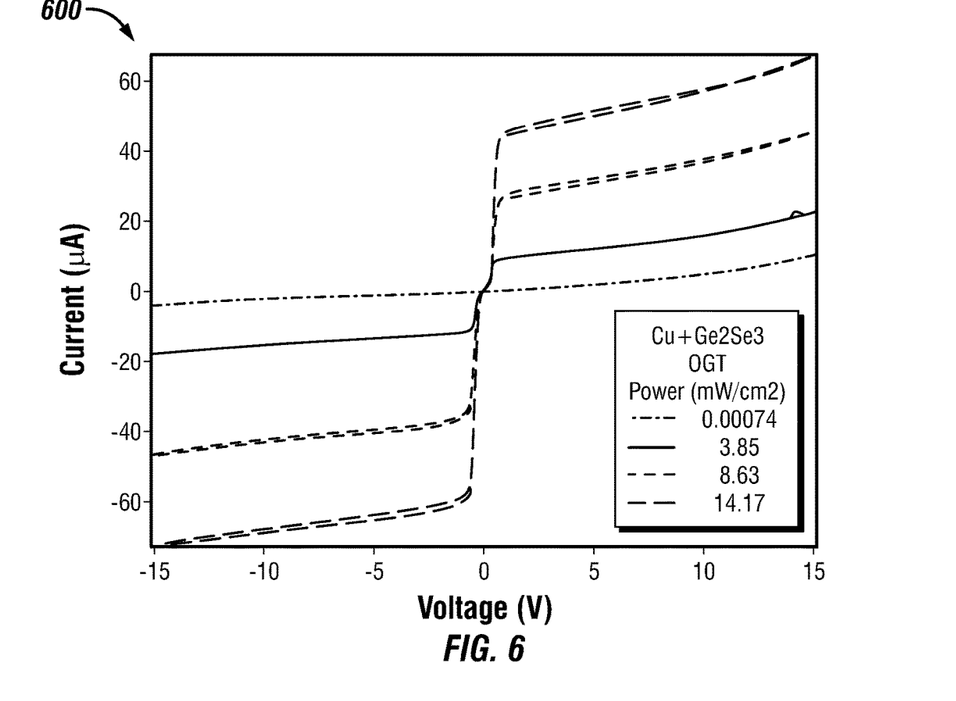
FIG. 6 is a graph that includes I-V curves for an embodiment of an OGT device under different light intensity conditions.

FIG. 6 is a graph 600 that includes I-V curves for an embodiment of an OGT device 100 under different light intensity conditions. Specifically, the light intensity conditions tested were at 0.00074 mW/cm$^2$, 3.85 mW/cm$^2$, 8.63 mW/cm$^2$, and 14.14 mW/cm$^2$. The OGT device 100 of FIG. 6 includes layers comprised of Cu with Ge$_2$Se$_3$. A LED having a wavelength of 470 nm was aimed near the center region between the electrodes 180, 190 on the OGT device 100 to gate ON the OGT device 100. Other light sources could be used in place of the LED. For example, the light source could be, but is not limited to, a broadband microscope light source (from the microprobe station) as well as LEDs with wavelengths of 385, 525, 590, 616, 770, 850, 1060, and 1200 nm. As shown in FIG. 6, the OGT device 100 is able to conduct current bidirectionally based on the magnitude of the voltage.

When the LED was centered between the two electrodes 180, 190 on the OGT device 100, the positive and negative current amplitudes were similar as shown in FIG. 6. As the LED was moved towards one electrode, the current at that electrode increased, with the opposite polarity voltage sweep showing a decrease in amplitude. This is an indication that the photoconductivity occurs primarily at the electrodes 180, 190 of the OGT device 100. As shown in FIG. 6, there is a zero current 'dead zone' region around V=0 in the OGT device 100, which provides a block against unwanted sneak path current when operated as an access transistor, also referred to as a selector device, for a memristor or resistive memory element. The Cu plus Ge$_2$Se$_3$ OGT device 100 has a 'dead zone' between approximately +/−0.12 V. At voltages outside of this zone, the I-V curve has a diode-like shape until a voltage is reached where photoinduced current no longer changes with applied voltage, i.e. saturation.

Figure 7:
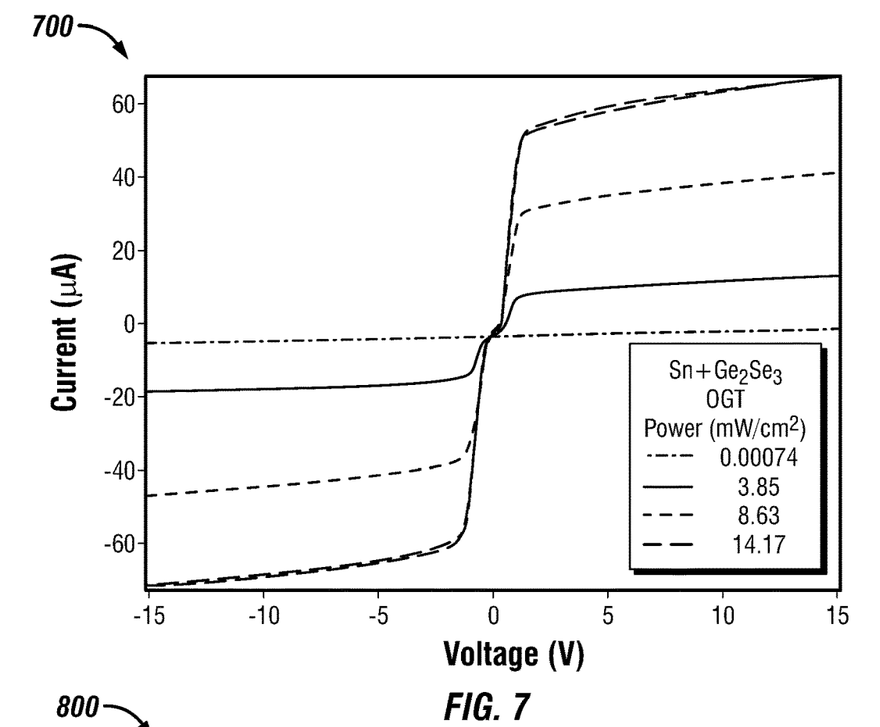
FIG. 7 is a graph that includes I-V curves for an embodiment of an OGT device under different light intensity conditions.

FIG. 7 is a graph 700 that includes I-V curves for an embodiment of an OGT device 100 under different light intensity conditions. Specifically, the light intensity conditions tested were at 0.00074 mW/cm$^2$, 3.85 mW/cm$^2$, 8.63 mW/cm$^2$, and 14.14 mW/cm$^2$. The OGT device 100 of FIG. 7 includes layers comprised of Sn with Ge$_2$Se$_3$. An LED having a wavelength of 470 nm was aimed near the center region between the electrodes 180, 190 on the OGT device 100 to gate ON the OGT device 100. Other light sources could be used in place of the LED. For example, the light source could be, but is not limited to, a broadband microscope light source (from the microprobe station) as well as LEDs with wavelengths of 385, 525, 590, 616, 770, 850, 1060, and 1200 nm. As shown in FIG. 7, the OGT device 100 is able to conduct current bidirectionally based on the magnitude of the voltage.

When the LED was centered between the two electrodes 180, 190 on the OGT device 100, the positive and negative current amplitudes were similar as shown in FIG. 7. As the LED was moved towards one electrode, the current at that electrode increased, with the opposite polarity voltage sweep showing a decrease in amplitude. This is an indication that the photoconductivity occurs primarily at the electrodes 180, 190 of the OGT device 100. As shown in FIG. 7, there is a zero current 'dead zone' region around V=0 in the OGT device 100, which provides a block against unwanted sneak path current when operated as an access transistor, also referred to as a selector device, for a memristor or resistive memory element. The Sn plus Ge$_2$Se$_3$ OGT device 100 has a 'dead zone' between approximately +/−0.21 V. At voltages outside of this zone, the I-V curve has a linear or slight diode-like shape until a voltage is reached where photoinduced current no longer changes with applied voltage, i.e. saturation.

The background, i.e. 'dark', measurements for the OGT devices 100 FIGS. 6 and 7 were collected with the LED and room lights off, but not enclosed in a dark box. For purposes of determining photocurrent, the background incident power is considered to correspond to the 'dark' current, and the resulting photocurrent ($I_{ph}$) is the difference between the measured current and $I_{dark}$. For each OGT device 100, the resultant photocurrent is linear with respect to light intensity when measured in the saturation region at 2 V, as shown in graph 800 of FIG. 8. This linear response is desirable for a phototransistor device. Also shown in FIG. 8, the photocurrent measured in an OGT device-memristor circuit, aligns with the photocurrent of the OGT devices 100 alone.

Figure 8:
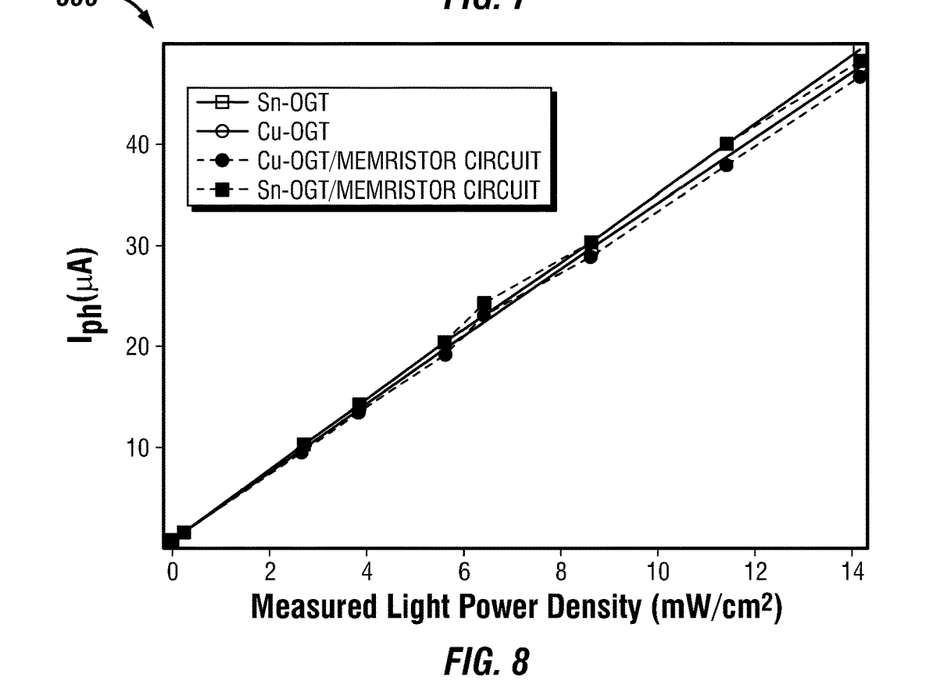
FIG. 8 is a graph that shows the resultant photocurrent is linear with respect to light intensity when measured in the saturation region at 2 V for various OGT devices alone and combined with a memristor.

Photocurrent ($I_{ph}=I_{means}-I_{dark}$) generated by 470 nm illumination measured at 2 V, as a function of light intensity. Graph 800 includes the photocurrent measured at 2 V for a Sn plus Ge$_2$Se$_3$ OGT device 100. Likewise, graph 800 includes the photocurrent measured at 2V for a Sn plus Ge$_2$Se$_3$ OGT device 100. Graph 800 also includes the photocurrent measure at 2V of memristor circuits that include either a Sn plus Ge$_2$Se$_3$ OGT device 100 or a Cu plus Ge$_2$Se$_3$ OGT device 100.

Figure 9:
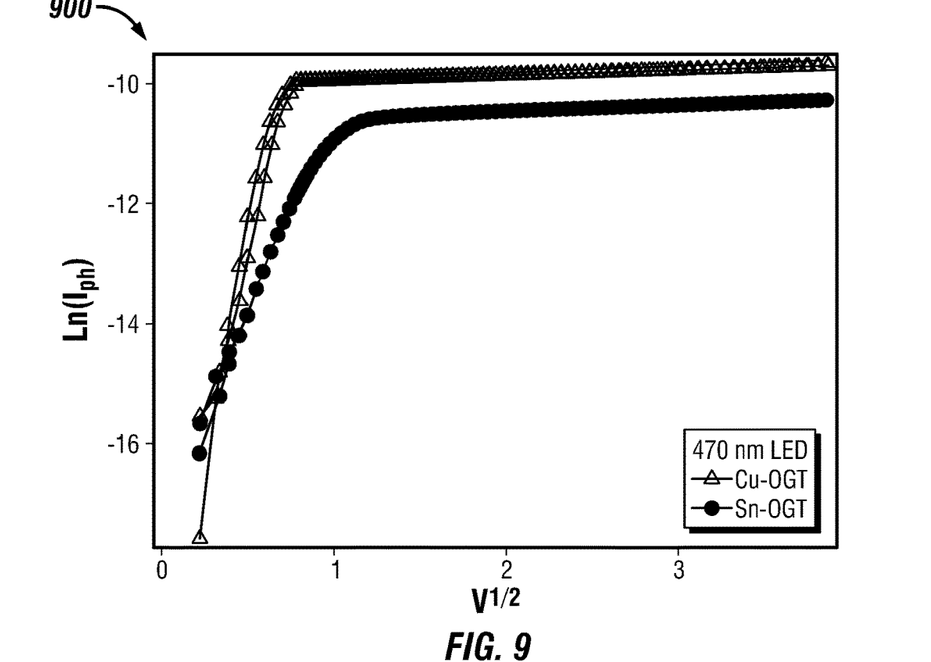
FIG. 9 is a graph that shows a linearity low voltages indicative of a Schottky photodiode for various OGT devices.

FIG. 9 is a graph 900 that shows a linearity low voltages indicative of a Schottky photodiode for both a Sn plus Ge$_2$Se$_3$ OGT device 100 and a Cu plus Ge$_2$Se$_3$ OGT device 100. At higher voltages, saturation is reached, and the photocurrent is unchanging with respect to applied voltage. Thus, both the Sn plus Ge$_2$Se$_3$ OGT device 100 and the Cu plus Ge$_2$Se$_3$ OGT device 100 may act as an ideal selector device for variable resistive memory devices 240.

Figure 10:
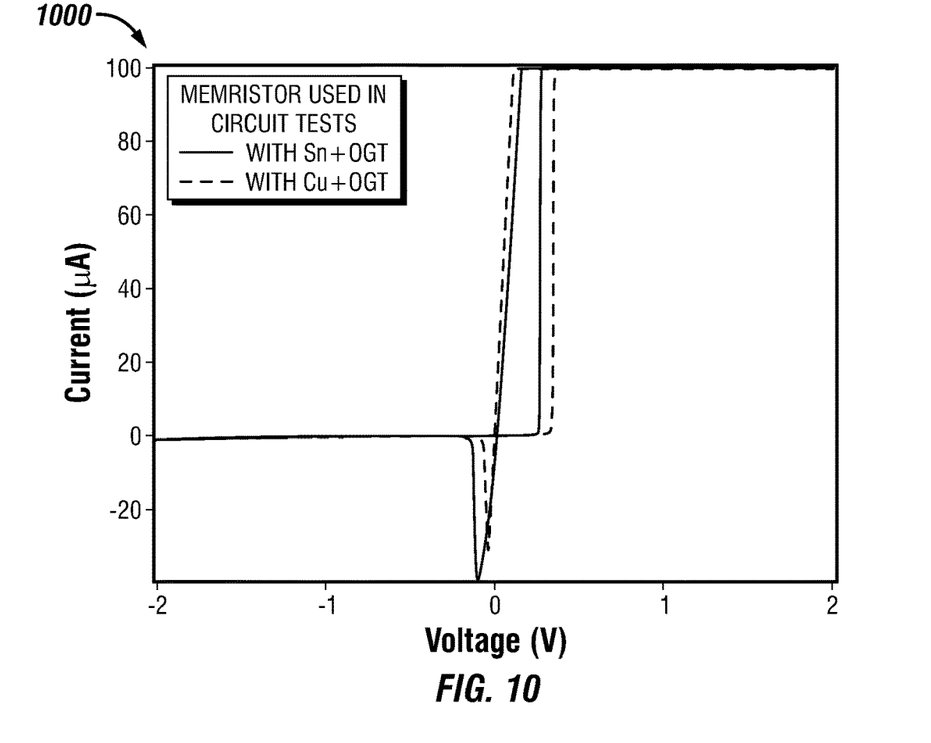
FIG. 10 is a graph showing I-V curves measured for a memristor used with a Sn OGT device and a memristor used with a Cu OGT device.

FIG. 10 is a graph 1000 showing I-V curves measured a memristor 240 used with a Sn OGT device 100 and a memristor 240 used with a Cu OGT device. A compliance current of 100 μA was applied during measurement of the memristor to limit the current through the device to prevent potential damage. The I-V curves shown in graph 1000 are typical for Tungsten Ge$_2$Se$_3$ based memristors 240, but due to the amorphous nature of the active memristor material, memristors 240 will have slight variation in threshold voltage and I-V curve shape as a function of device use and operation conditions. A memristor write threshold voltage may typically be in the range of 0.24 V to 0.35 V. A typical memristor erase threshold voltage may be in the range of −50 mV to −200 mV. As discussed herein, the Sn plus Ge$_2$Se$_3$ OGT device 100 has a 'dead zone' between approximately +/−0.21 V. Likewise, the Cu plus Ge$_2$Se$_3$ OGT device 100 has a 'dead zone' between approximately +/−0.12 V. Thus, both OGT devices 100 may allow a memristor 240 to switch when the programming voltage is applied, without the OGT device hindering access during a programming operation. Further, the OGT devices 100 block current flow when a memristor 240 is not being accessed.

Figure 11:
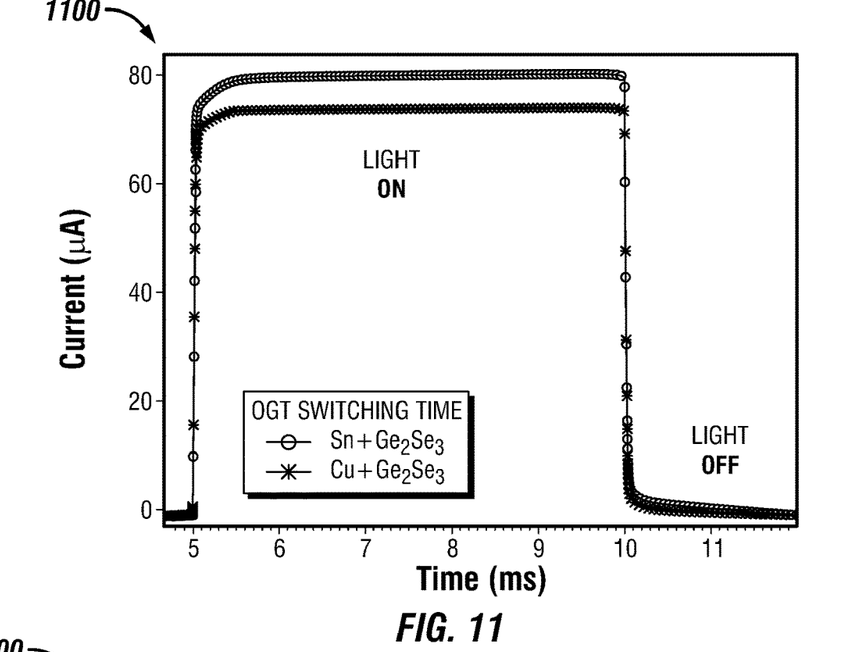
FIG. 11 is a graph that shows a typical response time of an OGT device to a 770 nm LED light pulse.

FIG. 11 is a graph 1100 that shows a typical response time of an OGT device 100 to a 770 nm LED light pulse. The LED switching time is in the ns range, which is faster than the response speed of the OGT devices in the measurement configuration. The response speed of the Cu plus Ge$_2$Se$_3$ OGT device 100 was approximately 11 μs. The response speed of the Sn plus Ge$_2$Se$_3$ OGT device 100 was approximately 15 μs. The OFF to ON transition is at least an order of magnitude faster. Arguably, the OGT devices 100 may have an even faster switching time as the capacitance of the experimental components such as cables, connectors, etc. may have contributed at least some delay.

Figure 12:
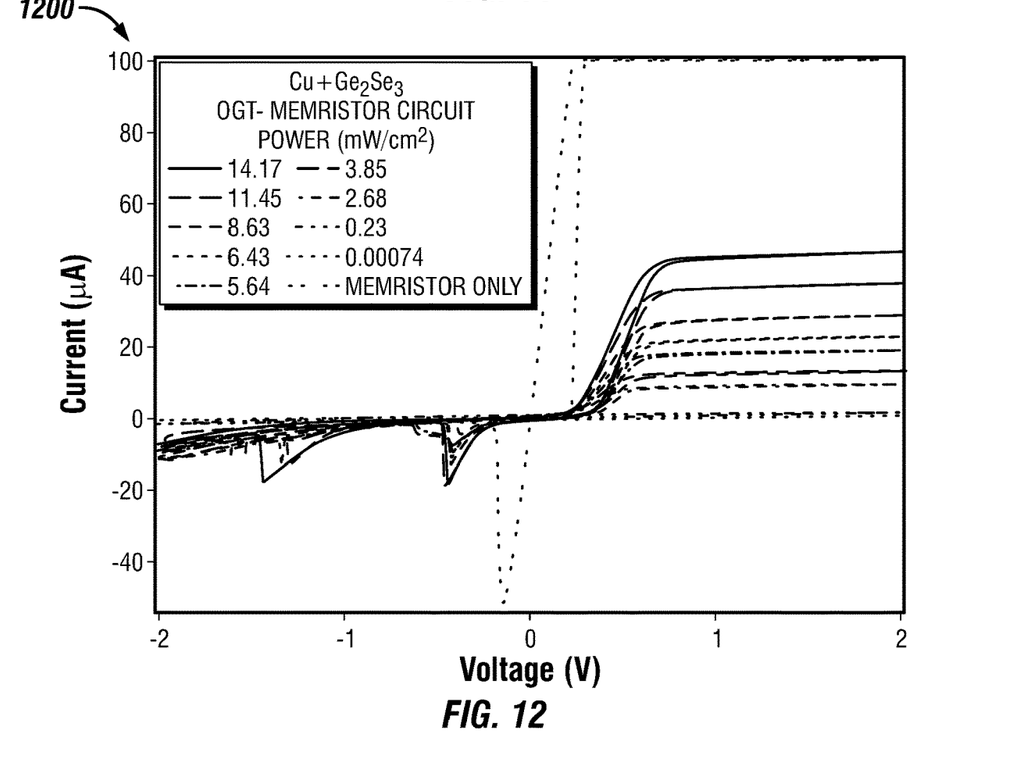
FIG. 12 is a graph showing I-V curves of an OGT-memristor circuit include one embodiment of an OGT device.

FIG. 12 is a graph 1200 showing the I-V curves for an OGT-memristor circuit using a Cu plus $Ge_2Se_3$ OGT device 100. For comparison, the memristor-only I-V curve is overlaid with the I-V curves for an OGT-memristor circuit using a Cu plus $Ge_2Se_3$ OGT device 100. As the voltage is incremented to higher values in the positive direction, the memristor 240 appears to write to a lower resistance when its threshold voltage is exceeded and the current through the OGT device 100 is high enough to latch the device. The saturation current of the OGT device 100, which is set by the light intensity, may determine the memristor ON state resistance. The backwards voltage sweep, which complete the 'loop' in the positive voltage quadrant shows that the memristor 240 has been written to a lower resistance state. The negative voltage erase sweeps show the memristor 240 in a low resistance state until the memristor 240 erase threshold voltage and current are reached. The memristor 240 may exhibit two erased states, which can be seen in the I-V curves shown in FIG. 12.

Figure 13:
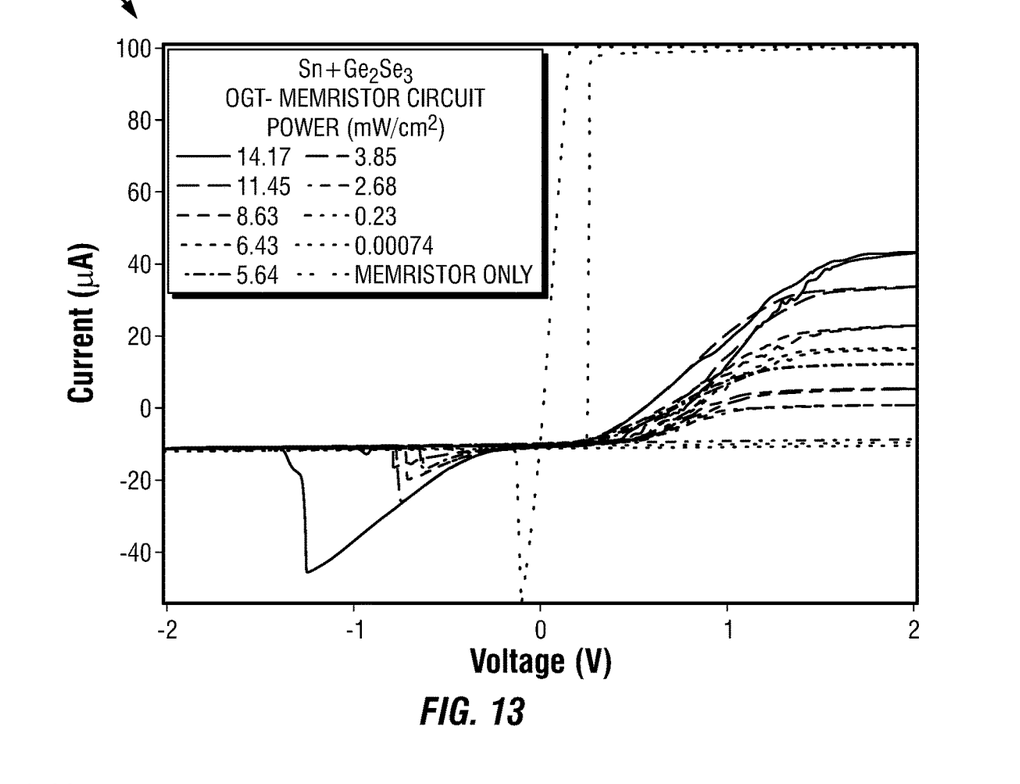
FIG. 13 is a graph showing I-V curves of an OGT-memristor circuit include one embodiment of an OGT device.

FIG. 13 is a graph 1300 showing the I-V curves for an OGT-memristor circuit using a Sn plus $Ge_2Se_3$ OGT device 100. For comparison, the memristor-only I-V curve is overlaid with the I-V curves for an OGT-memristor circuit using a Sn plus $Ge_2Se_3$ OGT device 100. As the voltage is incremented to higher values in the positive direction, the memristor 240 appears to write to a lower resistance when its threshold voltage is exceeded and the current through the OGT device 100 is high enough to latch the device. The saturation current of the OGT device 100, which is set by the light intensity, may determine the memristor ON state resistance. The backwards voltage sweep, which complete the 'loop' in the positive voltage quadrant shows that the memristor 240 has been written to a lower resistance state. The negative voltage erase sweeps show the memristor 240 in a low resistance state until the memristor 240 erase threshold voltage and current are reached.

Figure 14:
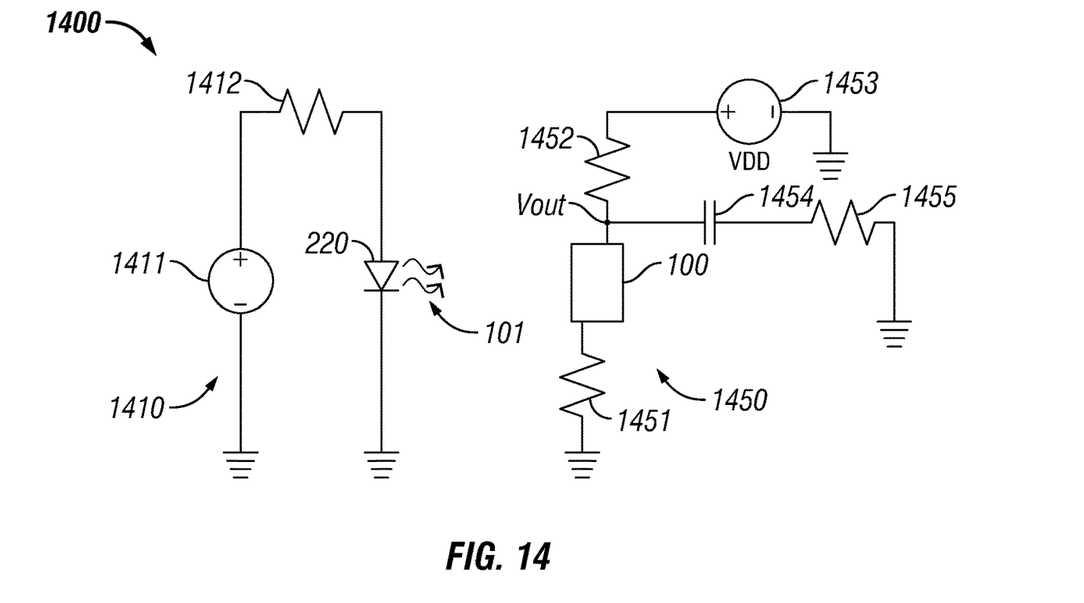
FIG. 14 is a schematic of a system for an optical amplifier.

FIG. 14 is a schematic of a system 1400, which may be implemented as a single circuit or multiple circuits, for an optical amplifier. The system 1400 may include a first sub circuit 1410 and a second sub circuit 1450. The first sub circuit 1410 includes a light source 220 configured to emit light 101. The first sub circuit 1410 includes means for driving the light source 220, which may be a LED. The first sub circuit 1410 includes a power source 1411 and may include one or more resistors 1412 positioned between the power source 1411 and the light source 220. The light 101 emitted by the light source 220 is transmitted to an OGT device 100 located within the second sub circuit 1450. The second sub circuit 1450 may include resistors 1451, 1452, 1453, a capacitor 1454, and $V_{DD}$ 1453. The reception of light 101 by the OGT device 100 gates the OGT device 100 ON and a Vout is produced that is amplified with respect to the magnitude of light received by the OGT device 100. The second sub circuit 1450 receives an optical signal, light 101, and converts the optical signal to an electrical signal Vout. The system 1400 may be used to convert a small optical signal to generate a larger electrical signal as would be appreciated by one of ordinary skill in the art having the benefit of this disclosure.

Figure 15:
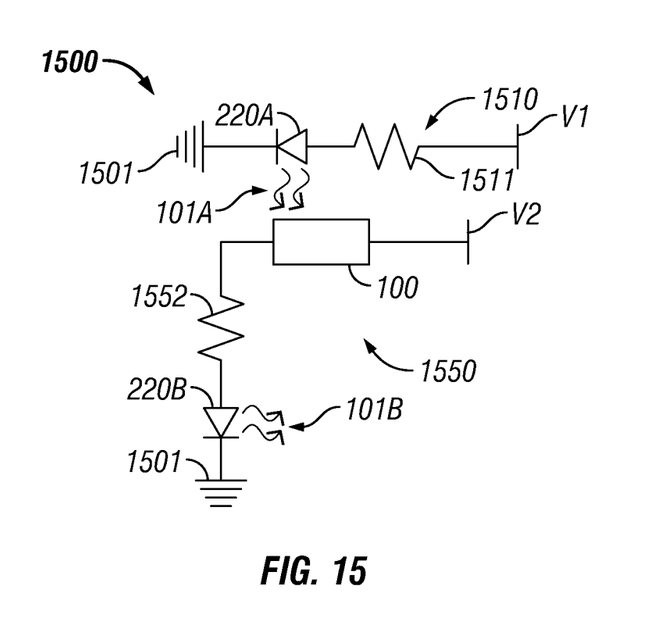
FIG. 15 is a schematic of a system for a wavelength converter.

FIG. 15 is a schematic of a system 1500, which may be implemented as a single circuit or multiple circuits, for converting a wavelength, amplifying a light intensity, or decreasing a light intensity. The system 1500 may include a first sub circuit 1510 and a second sub circuit 1550. The first sub circuit 1510 is configured to drive a first light source 220A configured to emit light 101A at a first wavelength. For example, the first light source 220A may be a LED configured to emit light 101A at 470 nm. The first sub circuit 1510 is connected to ground 1501 and $V_{DD}$, shown as V1, and may include one or more resistors 1511 between $V_{DD}$, shown as V1, and the first light source 220A.

The light 101A emitted by the first light source 220A is received by an OGT device 100 located within the second sub circuit 1550. The second sub circuit 1550 may include one or more resistors 1552 positioned between the OGT device 100 and a second light source 220B. The second sub circuit 1550 is connected to ground 1501 and includes a $V_{DD}$, shown as V2, which may be V1. The reception of the light 101A by the OGT device 100 gates the OGT device 100 ON. The second sub circuit 1550 is configured to drive second light source 220B to emit light 101B when the OGT device 100 is gated ON. The light 101B is emitted from the second light source 220B is emitted at a different wavelength than the light 101A emitted from the first light source 220A. For example, the second light source 220B may be a LED that emits light 101B at 770 nm. The system 1500 takes light 101A of one wavelength, impinges that light on the OGT device 100, and the current/voltage provided from the OGT device 100 turning on (due to the light) drives the second light source 220B to emit light 101B of a different wavelength than the light 101A from the first light source 220A.

The system 1500 of FIG. 15 may also be used to amplify a light intensity. As discussed above, the first sub circuit 1510 is configured to drive a first light source 220A configured to emit light 101A at a first wavelength. For example, the first light source 220A may be a LED configured to emit light 101A at 470 nm. The first sub circuit is connected to ground 1501 and $V_{DD}$, shown as V1, and may include one or more resistors 1511 between $V_{DD}$, shown as V1, and the first light source 220A.

The light 101A emitted by the first light source 220A is received by an OGT device 100 located within the second sub circuit 1550. The second sub circuit 1550 may include one or more resistors 1552 positioned between the OGT device 100 and a second light source 220B, which may have the same wavelength as the first light source 220A. The second sub circuit 1550 is connected to ground 1501 and includes a $V_{DD}$, shown as V2, which may be V1. The reception of the light 101A by the OGT device 100 gates the OGT device 100 ON. The second sub circuit 1550 is configured to drive second light source 220B to emit light 101B when the OGT device 100 is gated ON. In one embodiment, the light 101A from the first light source 220A received by the OGT device 100 may have a first intensity that may be diminished due to the distance between the first light source 220A and the OGT device 100. In this instance, the system 1500 may be used as a repeater causing the second light source 220B to emit light 101B at the same frequency, but at second intensity being a higher intensity than the diminished light intensity received by the OGT device 100. In another embodiment, the second sub circuit 1550 may be configured to drive the second light source 220B with a higher current than the current applied to the first light source 220A, thus producing light 101B that is emitted from the second light source 220B with a higher intensity that light 101A. The system 1500 could also be configured to reduce the intensity of light as would be recognized by one of ordinary skill in the art having the benefit of this disclosure.

Figure 16:
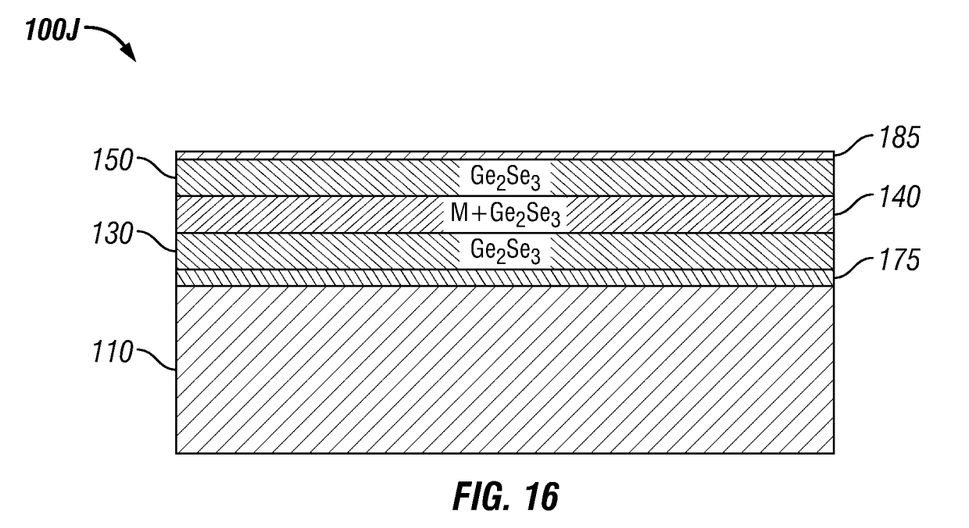
FIG. 16 is an embodiment of an OGT device.

FIG. 16 is an embodiment of an OGT device 100J. The OGT device 100J includes active material, which is comprised of a plurality of layers 130, 140, 150 deposited, onto a substrate 110. The substrate 110 may include doped silicon. In particular, the substrate 110 may be p-type silicon substrate. Other substrates, such as an n-type substrate, may also be contemplated.

The active material is comprised of a plurality of layers 130, 140, 150 deposited onto the substrate 110. The first layer 130 may be germanium selenide (GeSe) without the addition of other elements. The first layer 130 may be formed by sputtering GeSe. Specifically, the first layer 130 may be $Ge_2Se_3$. A second layer 140 is deposited onto the first layer 130. The second layer 140 may include GeSe and an element. Specifically, the second layer 140 may be $Ge_2Se_3$ plus a metal. Examples of metals that may be used include tin (Sn) and copper (Cu). However, the element may be, but is not limited to, other materials such as aluminum (Al), tungsten (W), titanium (Ti), and carbon (C). Other elements may be used as would be appreciated by one of ordinary skill in the art having the benefit of this disclosure. The second layer 140 may be formed by co-sputtering the element with GeSe onto the first layer 130.

A third layer 150 is deposited onto the second layer 140. The third layer 150 is GeSe without any additional elements. Specifically, the third layer 150 may be $Ge_2Se_3$. The third layer 150 may be formed by sputtering GeSe onto the second layer 140. The OGT device 100J may include a first electrode, or terminal, 175 connected to the first layer 130 and a second electrode, or terminal, 185 connected to the third layer 150. The number, location, and configuration of electrodes 175, 185 may vary depending on the application as would be appreciated by one of ordinary skill in the art having the benefit of this disclosure. For example, the OGT device 100J may include a single electrode 185 connected to the top layer (e.g., the third layer 150) when used in series. In some embodiments, the electrode 185 may be transparent. For example, the electrode 185 may be, but is not limited to, indium tin oxide. In other embodiments, the OGT device 100J may include two electrodes 180, 190 in contact with the top layer (e.g., the third layer 150) and spaced apart as shown in FIG. 1.

Although this disclosure has been described in terms of certain preferred embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof.

What is claimed is:

1. An optically activated device comprising:
a substrate;
a first layer comprising germanium selenide (GeSe);
a second layer comprising GeSe and an element;
a third layer comprising GeSe, wherein the second layer is positioned between the first layer and the third layer; and
wherein the first layer, second layer, and third layer comprise an active material, wherein the active material conducts current bidirectionally in a presence of light, and wherein the active material does not conduct appreciable current in the absence of light.

2. The optically activated device of claim 1, further comprising at least one electrode connected to the third layer.

3. The optically activated device of claim 1, further comprising:
a fourth layer comprising GeSe and the element, wherein the third layer is positioned between the second layer and the fourth layer;
a fifth layer comprising GeSe, wherein the fourth layer is positioned between the third layer and the fifth layer;
a first electrode; and
a second electrode, wherein the first layer, second layer, third layer, fourth layer, and fifth layer comprise the active material, wherein the active material conducts current bidirectionally in a presence of light, and wherein the active material does not conduct appreciable current in the absence of light.

4. The optically activated device of claim 3, wherein active material can conduct the current bidirectionally dependent on a voltage applied to the active material via the first and second electrodes.

5. The optically activated device of claim 4, wherein the first electrode and the second electrode are both connected to the fifth layer.

6. The optically activated device of claim 4, wherein an amount of current conducted by the active material is dependent on an intensity of light applied to the active material.

7. The optically activated device of claim 6, wherein the optically activated device comprises no more than two electrodes in contact with the active material.

8. The optically activated device of claim 7, wherein the optically active device exhibits a current-voltage curve with operating regions that include at least a linear region and a saturation region.

9. The optically activated device of claim 8, further comprising a silicon dioxide layer between the first layer and the substrate.

10. The optically activated device of claim 3, the first layer having a thickness of approximately 100 angstroms, the second layer having a thickness of approximately 10 angstroms to 30 angstroms, the third layer having a thickness of approximately 100 angstroms, the fourth layer having a thickness of approximately 10 angstroms to 30 angstroms, and the fifth layer having a thickness of approximately 100 angstroms.

11. The optically activated device of claim 10, wherein the GeSe further comprises $Ge_2Se_3$.

12. The optically activated device of claim 11, wherein the element comprises tin (Sn), aluminum (Al), carbon (C), Chromium (Cr), Tungsten (W), Titanium (Ti), or copper (Cu).

13. The optically activated device of claim 12, wherein the substrate includes a p-type silicon substrate.

14. A system comprising:
a memory device;
an optically gated transistor (OGT) device, wherein the OGT device is capable of bidirectional operation; and
wherein the OGT device connects the memory device to an electronic circuit when the OGT device is optically activated and wherein the OGT device isolates the memory device from the electronic circuit when the OGT device is not optically activated.

15. The system of claim 14, wherein the OGT device exhibits a current-voltage curve with operating regions that include at least a linear region and a saturation region.

16. The system of claim 15, wherein the memory device comprises a memristor.

17. The system of claim 15, wherein the memory device comprises a memristor array.

18. The system of claim 15, wherein the memory device further comprises an array of resistive random-access memory devices.

19. The system of claim 18, wherein the array of resistive random-access memory devices may be programmed simultaneously via optical imprinting based on a light intensity of an input signal.

20. The system of claim 15, wherein the OGT device further comprises active material that comprises alternating layers of germanium selenide and layers of germanium selenide with an added element.

21. The system of claim 20, wherein the added element is copper or tin.

22. An optical signal amplifier system comprising:
a light source;
a first sub circuit configured to drive the light source to emit light having a magnitude of intensity greater than a magnitude of intensity of incident light;
an optically gated transistor (OGT) device; and
a second sub circuit connected to the OGT device, wherein OGT device receives light emitted from the light source and provides an electrical signal based on the received light.

23. The system of claim 22, wherein the second sub circuit is configured to amplify the electric signal with respect to the magnitude of intensity of the emitted light.

24. The system of claim 23, wherein the first sub circuit and the second sub circuit are incorporated into a single circuit.

25. A system comprising:
a first light source connected to a first circuit configured to drive the first light source to emit light having a first wavelength;
an optically gated transistor (OGT) device configured to receive light emitted from the first light source; and
a second light source connected to the OGT device, wherein receipt of light from the first light source by the OGT device causes the second light source to emit light having a second wavelength.

26. The system of claim 25, wherein the second wavelength differs from the first wavelength.

27. The system of claim 25, the light emitted from the first light source having a first intensity and the light emitted from the second light source having a second intensity, wherein the second intensity is greater than the first intensity and wherein the second wavelength is equal to the first wavelength.

28. The system of claim 25, the light received by the OGT device from the first light source having a first intensity and the light emitted from the second light source having a second intensity, wherein the second intensity is greater than the first intensity and wherein the second wavelength is equal to the first wavelength.

* * * * *